(12) United States Patent
Wang

(10) Patent No.: US 11,458,729 B2
(45) Date of Patent: Oct. 4, 2022

(54) PIEZOELECTRIC ACTUATOR AND METHOD FOR PRODUCING PIEZOELECTRIC ACTUATOR

(71) Applicant: BROTHER KOGYO KABUSHIKI KAISHA, Nagoya (JP)

(72) Inventor: Rui Wang, Nagoya (JP)

(73) Assignee: BROTHER KOGYO KABUSHIKI KAISHA, Nagoya (JP)

(*) Notice: Subject to any disclaimer, the term of this patent is extended or adjusted under 35 U.S.C. 154(b) by 494 days.

(21) Appl. No.: 16/658,346

(22) Filed: Oct. 21, 2019

(65) Prior Publication Data
US 2020/0171827 A1    Jun. 4, 2020

(30) Foreign Application Priority Data
Nov. 30, 2018 (JP) .............................. JP2018-225042

(51) Int. Cl.
*B41J 2/14* (2006.01)
*H01L 41/00* (2013.01)
(Continued)

(52) U.S. Cl.
CPC .......... *B41J 2/14233* (2013.01); *H01L 41/00* (2013.01); *H01L 41/0833* (2013.01);
(Continued)

(58) Field of Classification Search
CPC .......... B41J 2/14233; B41J 2002/14258; B41J 2202/11; H01L 41/00; H01L 41/0833; H01L 41/318
See application file for complete search history.

(56) References Cited

U.S. PATENT DOCUMENTS 8,820,898 B2 * 9/2014 Miyazawa ............. B41J 2/1626
                                                    310/358
8,870,352 B2 * 10/2014 Nakayama ............. B41J 2/1634
                                                    347/68
(Continued)

FOREIGN PATENT DOCUMENTS

JP         1346828 A2 *  9/2003 ............... B41J 2/14
JP    2010-214634 A      9/2010
(Continued)

*Primary Examiner* — Geoffrey S Mruk
(74) *Attorney, Agent, or Firm* — Scully, Scott, Murphy & Presser, P.C.

(57) ABSTRACT

A piezoelectric actuator includes: a vibration plate: a first piezoelectric body arranged on one side in a thickness direction of the vibration plate; a second piezoelectric body arranged on a side, of the first piezoelectric body, opposite to the vibration plate in the thickness direction; a first electrode arranged between the vibration plate and the first piezoelectric body; a second electrode arranged between the first and second piezoelectric bodies in the thickness direction, and overlapping with the first electrode in the thickness direction; and a third electrode arranged on a side, of the second piezoelectric body, opposite to the first piezoelectric body in the thickness direction, and overlapping with the second electrode in the thickness direction. The second piezoelectric body covers at least a part of a first end surface, of the first piezoelectric body, which is an end surface in a first direction orthogonal to the thickness direction.

11 Claims, 9 Drawing Sheets

(51) Int. Cl.
     *H01L 41/083*     (2006.01)
     *H01L 41/318*     (2013.01)

(52) U.S. Cl.
     CPC ... *H01L 41/318* (2013.01); *B41J 2002/14258* (2013.01); *B41J 2202/11* (2013.01)

(56) References Cited

U.S. PATENT DOCUMENTS

| | | | |
|---|---|---|---|
| 10,500,853 B2 * | 12/2019 | Nakayama | B41J 2/14201 |
| 2004/0046481 A1 | 3/2004 | Takeuchi et al. | |
| 2010/0231659 A1 | 9/2010 | Ohta | |

FOREIGN PATENT DOCUMENTS

| | | |
|---|---|---|
| JP | 2010-284960 A | 12/2010 |
| JP | 2013-256137 A | 12/2013 |
| JP | 2013-256138 A | 12/2013 |
| WO | WO 02/073710 A1 | 9/2002 |

\* cited by examiner

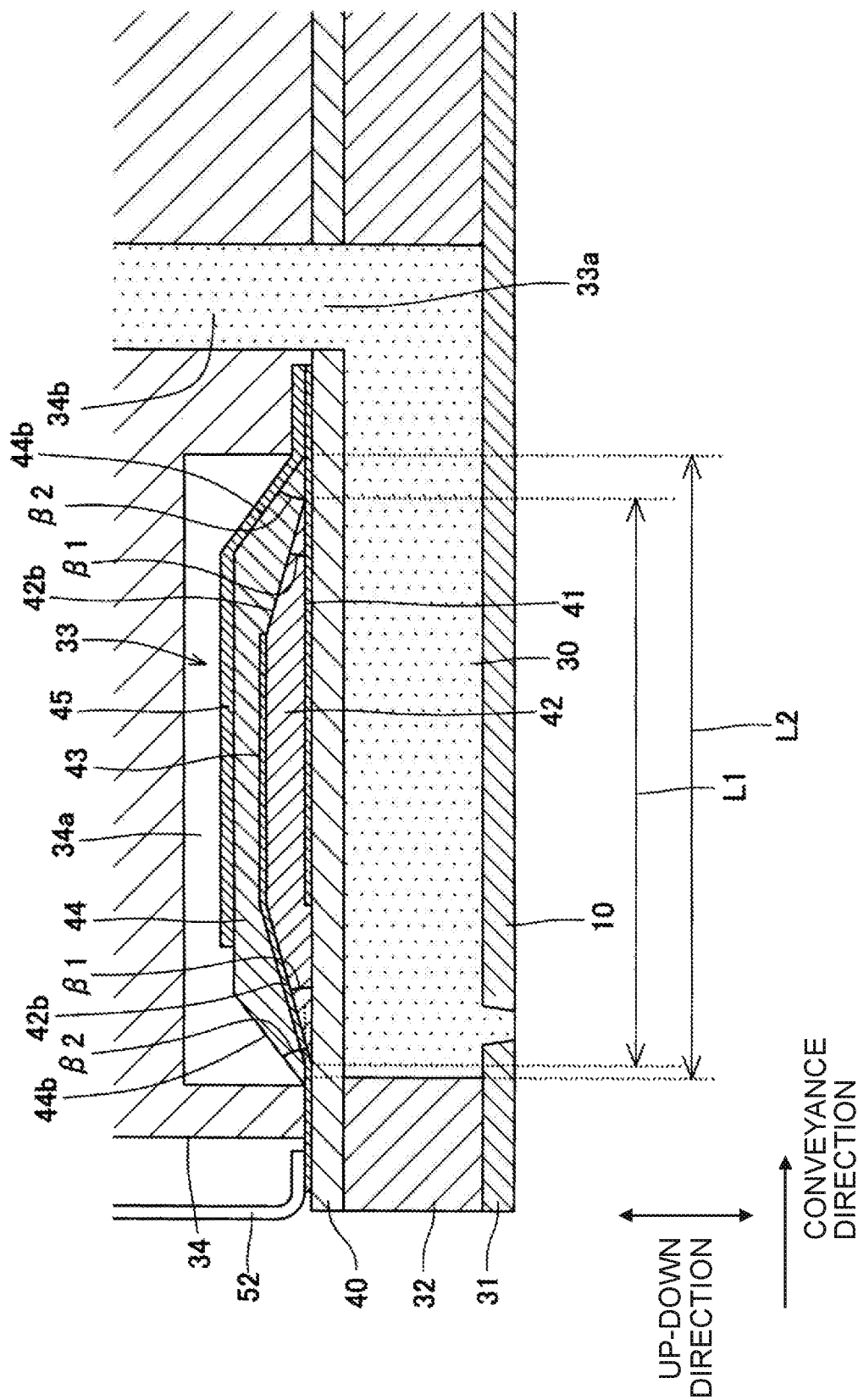

SHEET WIDTH DIRECTION
LEFT ←→ RIGHT

UP-DOWN DIRECTION ↕

CONVEYANCE DIRECTION

UP-DOWN DIRECTION

PIEZOELECTRIC ACTUATOR AND METHOD FOR PRODUCING PIEZOELECTRIC ACTUATOR

CROSS REFERENCE TO RELATED APPLICATION

The present application claims priority from Japanese Patent Application No. 2018-225042 filed on Nov. 30, 2018, the disclosure of which is incorporated herein by reference in its entirety.

BACKGROUND

Field of the Invention

The present teaching is related to a piezoelectric actuator and a method of producing a piezoelectric actuator.

Description of the Related Art

Japanese Patent Application Laid-open No. 2013-256137 describes, as a piezoelectric actuator, a piezoelectric element which applies pressure to an ink in a pressure generating chamber communicated with a nozzle. This piezoelectric element is provided with an elastic film, an insulating film, a plurality of first piezoelectric layers, a second piezoelectric layer, a first common electrode, a plurality of individual electrodes, and a second common electrode. The elastic film covers a plurality of pressure chambers which are aligned to form a row in one direction. The insulating film is arranged on the upper surface of the elastic film, and the insulating film covers, together with the elastic film, the plurality of pressure chambers. Each of the plurality of first piezoelectric layers is arranged on the upper surface of the insulating film at a part or portion, of the upper surface, overlapping with one of the plurality of pressure chambers in the up-down direction. The second piezoelectric layer continuously extends over the plurality of first piezoelectric layers and covers the upper surface of the insulating film, the upper surfaces of the plurality of first piezoelectric layers, and both end surfaces on the one direction of each of the plurality of first piezoelectric layers. The first common electrode is arranged between the insulating film and the plurality of first piezoelectric layers, and extends continuously over the plurality of first piezoelectric layers. Each of the plurality of individual electrodes are arranged between one of the plurality of first piezoelectric layers and the second piezoelectric layer. The second common electrode is arranged on the upper surface of the second piezoelectric layer, and continuously extends over a part or portion, of the upper surface, overlapping with the plurality of first piezoelectric layers in the up-down direction.

In the above-described piezoelectric element, a part or portion, of each of the plurality of first piezoelectric layers, which is sandwiched between the first common electrode and one of the plurality of individual electrodes becomes an active part or portion which is piezoelectrically deformable by the difference in the potential between the individual electrode and the first common electrode. Further, a part or portion, of the second piezoelectric layer, which is sandwiched between the second common electrode and each of the plurality of individual electrodes also becomes an active part or portion which is piezoelectrically deformable by the difference in the potential between the individual electrode and the second common electrode. By allowing the two active portions to be piezoelectrically deformed so as to allow the elastic film, the insulating film and the parts or portions, of the first and second piezoelectric layers, which overlap in the up-down direction with each of the plurality of pressure chambers to deform greatly, thereby making it possible to apply a large pressure to the ink inside each of the plurality of pressure chambers.

SUMMARY

Here, in a case that the piezoelectric element described in Japanese Patent Application Laid-open No. 2013-256137 is produced, for example, a layer of a piezoelectric material (piezoelectric material layer) is formed; then etching is performed for the piezoelectric material layer so as to form first piezoelectric body layers. Afterwards, a layer of another piezoelectric material which covers the first piezoelectric body layers are formed; then etching is performed for the another piezoelectric material layer so as to form a second piezoelectric body layer. In a case that the piezoelectric material layers are formed, the piezoelectric material is coated, for example, by the spin coat method, in some cases. In this case, at a point of time when the first piezoelectric body layers are formed, a surface wherein the piezoelectric material layer which is to be the second piezoelectric body layer is to be formed thereafter includes convex parts (convex portions) in which the first piezoelectric body layers are arranged and concave parts (concave portions) in which the first piezoelectric body layers are not arranged. Accordingly, in a case that then the application of the piezoelectric material layer is performed by the spin coat method to as to form the piezoelectric layer which is to be the second piezoelectric body layer, the thickness of the piezoelectric material layer is varied. (becomes uneven). Due to this, the thickness of the second piezoelectric body layer also varies. In a case that there is any variation in the thickness of the second piezoelectric body layer, there arises such a fear that an amount of deformation generated when the piezoelectric element is driven might vary or become uneven, and that any desired driving characteristic of the piezoelectric element might not be obtained.

An object of the present teaching is to provide a piezoelectric actuator provided with two layers of a piezoelectric body (two piezoelectric body layers) which are stacked and in which the thickness of the piezoelectric body hardly varies, and a method for producing the piezoelectric actuator.

According to an aspect of the present reaching, there is provided a piezoelectric actuator including: a vibration plate; a first piezoelectric body arranged on one side in a thickness direction of the vibration plate; a second piezoelectric body arranged on a side, of the first piezoelectric body, which is opposite to the vibration plate in the thickness direction; a first electrode arranged between the vibration plate and the first piezoelectric body in the thickness direction; a second electrode arranged between the first piezoelectric body and the second piezoelectric body in the thickness direction, and overlapping with the first electrode in the thickness direction; and a third electrode arranged on a side, of the second piezoelectric body, which is opposite to the first piezoelectric body in the thickness direction, and overlapping with the second electrode in the thickness direction, wherein the second piezoelectric body covers at least a part of a first end surface of the first piezoelectric body, the first end surface being an end surface in a first direction orthogonal to the thickness direction, and the first end surface is inclined with respect to the first direction at an inclination angle smaller than that of a second end surface of the second piezoelectric body, the second end surface being an end surface in the first direction.

BRIEF DESCRIPTION OF THE DRAWINGS

FIG. 4 is a cross-sectional view taken along a line IV-IV in FIG. 2.

DESCRIPTION OF THE EMBODIMENTS

In the following, an embodiment of the present teaching will be explained.

<Schematic Configuration of Printer 1>

Figure 1:
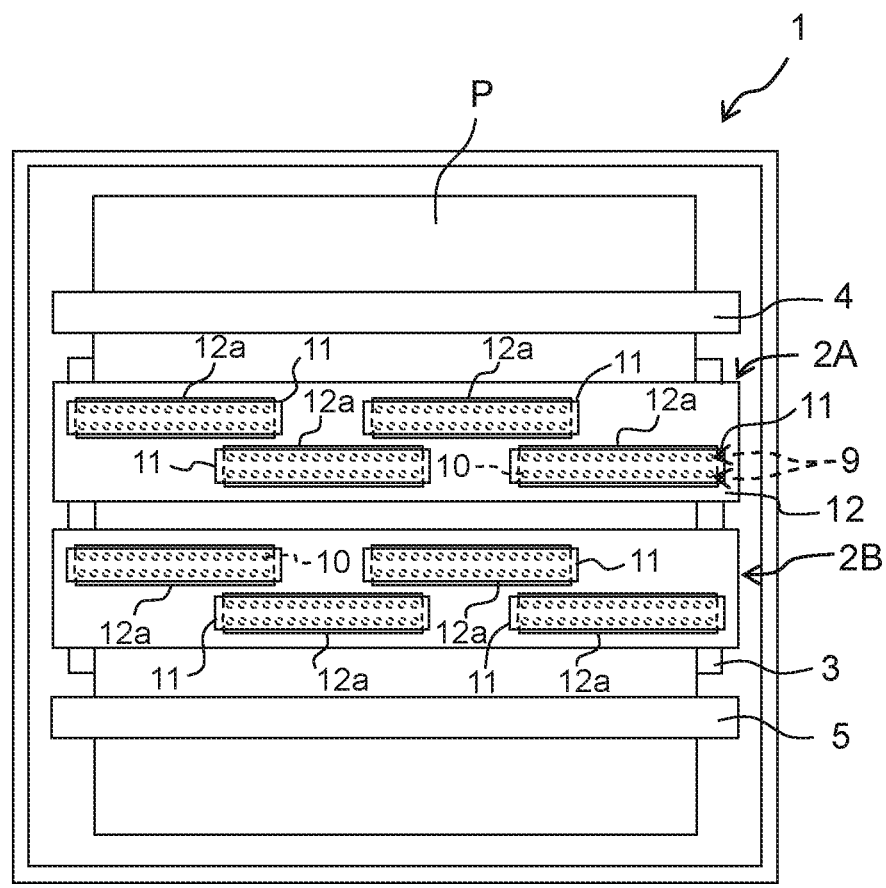
FIG. 1 is a schematic view depicting the configuration of a printer according to an embodiment of the present teaching.

As depicted in FIG. 1, a printer 1 according to the present embodiment is provided with two ink-jet heads 2A and 2B, a platen 3, and conveying rollers 4 and 5. The ink-jet head 2A and the ink-jet head 2B are arranged side by side in a conveyance direction (corresponding to a "second direction" of the present teaching) in which a recording paper sheet P is conveyed, and the ink-jet head 2B is located on the downstream side in the conveyance direction of (with respect to) the inkjet head 2A. Each of the ink-jet heads 2A and 2B is provided with four head units 11 and a holding member 12.

Each of the four head units 11 has a plurality of nozzles 10 which are open in a lower surface of the head unit 11. The plurality of nozzles 10 are aligned in a paper width direction (corresponding to a "first direction", "one direction" of the present teaching) which is orthogonal to the conveyance direction so as to form a nozzle row 9. The head unit 11 has two pieces of the nozzle row 9 which are arranged side by side in the conveyance direction. In the two nozzle rows 9, the positions in the paper width direction of the nozzles 10 are same. Note that in the following explanation, the right side and the left side of the paper width direction are defined as depicted in FIG. 1.

In each of the head units 11 included in the ink-jet head 2A, a black ink is discharged (jetted) from nozzles 10 constructing a nozzle row 9 included in the tow nozzle rows 9 and arranged on the upstream side in the conveyance direction, and a yellow ink is discharged from nozzles 10 constructing a nozzle row 9 included in the tow nozzle rows 9 and arranged on the downstream side in the conveyance direction. In each of the head units 11 included in the ink-jet head 2B, a cyan ink is discharged from nozzles 10 constructing a nozzle row 9 included in the tow nozzle rows 9 and arranged on the upstream side in the conveyance direction, and a magenta ink is discharged from nozzles 10 constructing a nozzle row 9 included in the tow nozzle rows 9 and arranged on the downstream side in the conveyance direction.

Further, in each of the ink-jet heads 2A and 2B, two head units 11 among the four head units 11 are arranged on the upstream side in the conveyance direction, and the remaining two head units 11 are arranged on the downstream side in the conveyance direction. The two head units 11 on the upstream side in the conveyance direction are arranged side by side in the paper width direction at a spacing distance (interval) therebetween. Further, the two head units 11 on the downstream side in the conveyance direction are also arranged side by side in the paper width direction at a spacing distance therebetween. The two head units 11 on the upstream side in the conveyance direction and the two head units 11 on the downstream side in the conveyance direction are arranged side by side in the conveyance direction at an interval therebetween. Moreover, two head units 11 on the upstream side in the conveyance direction and two head units 11 on the downstream side in the conveyance direction are arranged so that the positions in the paper width direction thereof are shifted. Further, a part of the nozzles 10 in each of the two head units 11 on the upstream side in the conveyance direction are overlapped, in the conveyance direction, with a part of the nozzles 10 in one of the two head units 11 on the downstream side in the conveyance direction. With this, the plurality of nozzles 10 of the four head units 11 are arranged in the paper width direction over the entire length of the recording paper sheet P. Namely, each of the ink-jet heads 2A and 2B is a so-called line head extending in the paper width direction over the entire length of the recording paper sheet P.

The holding member 12 is a plate-shaped member having a rectangular shape extending in the paper width direction over the entire length of the recording paper P. The holding member 12 is formed with four through holes 12a corresponding to the four head units 11, respectively. The nozzles 10 in each of the four head units 11 are exposed to the lower side (the side of the recording paper sheet P) from one of the four through holes 12a corresponding thereto.

The platen 3 is arranged at a location below the ink-jet heads 2A and 2B, and faces (is opposite to) the plurality of nozzles 10 of the inkjet head 2A and 2B. The platen 3 supports the recording paper sheet P from therebelow.

The conveying roller 4 is arranged on the upstream side in the conveyance direction with respect to the ink-jet heads 2A and 2B and the platen 3. The conveying roller 5 is arranged on the downstream side in the conveyance direction with respect to the ink-jet heads 2A and 2B and the platen 3. The conveying rollers 4 and 5 convey the recording paper sheet P in the conveyance direction.

Further, in the printer 1, recording is performed with respect to the recording paper P by causing the ink-jet heads 2A and 2B to discharge (jet) the ink(s) from the plurality of nozzles 10 toward the recording paper sheet P, while conveying the recording paper sheet P in the conveyance direction by the conveying rollers 4 and 5.

<Head Unit 11>

Figure 2:
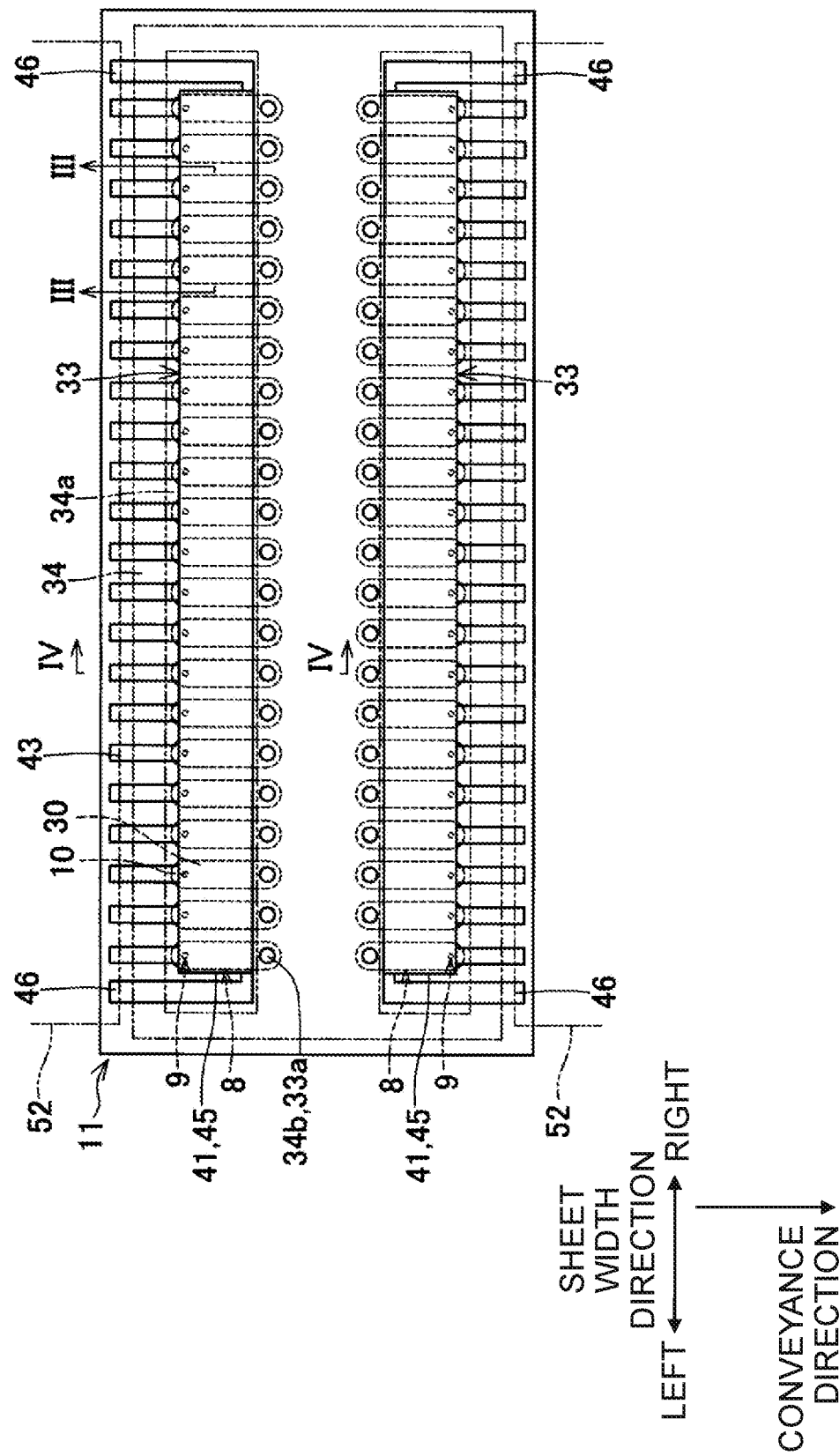
FIG. 2 is a plan view of a head unit.
Figure 3:
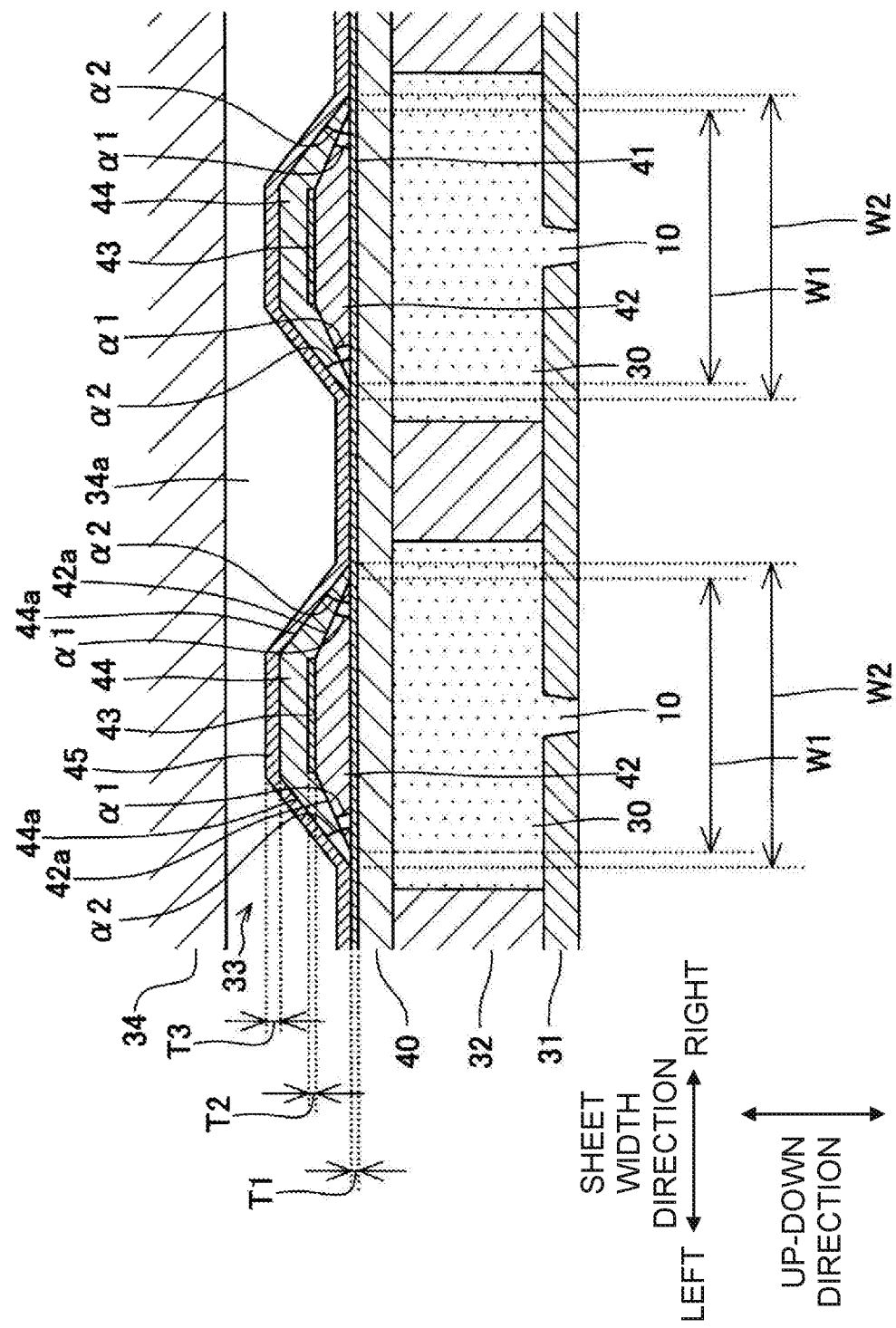
FIG. 3 is a cross-sectional view taken along a line III-III in FIG. 2.

Next, the head units 11 will be explained. As depicted in FIGS. 2 to 4, each of the head units 11 is provided with a nozzle plate 31, a flow channel substrate 32, two piezoelectric actuators 33, and a protective substrate 34.

The nozzle plate 31 is formed of a synthetic resin material such as polyimide, etc. The nozzle plate 31 has the plurality of nozzles 10 constricting the above-described two nozzle rows 9.

The flow channel substrate 32 is formed of silicon (Si) and is arranged on the upper surface of the nozzle plate 31. The flow channel substrate 32 has a plurality of pressure chambers 30. The plurality of pressure chambers 30 are provided individually to the plurality of nozzles 10, respectively. Each of the plurality of pressure chambers 30 is long in the conveyance direction and overlaps, in an up-down direction (corresponding to a "thickness direction" of the present teaching), with a nozzle 10 included in the plurality of nozzles 10 and corresponding thereto, at an end, on one side in the conveyance direction, of each of the plurality of pressure chambers 30. In the flow channel substrate 32, two pressure chamber rows 8 formed of the plurality of pressure chambers 30 aligned in the paper width direction, are arranged side by side in the conveyance direction. Here, the term "one side in the conveyance direction" indicates the upstream side in the conveyance direction in a case that the explanation is given about the configuration corresponding to a pressure chamber row 8 included in the two pressure chamber rows 8 and arranged on the upstream side in the conveyance direction; and the term "one side in the conveyance direction" indicates the downstream side in the conveyance direction in a case that the explanation is given about the configuration corresponding to a pressure chamber row 8 included in the two pressure chamber rows 8 and arranged on the downstream side in the conveyance direction.

The two piezoelectric actuators 33 correspond to the two pressure chamber rows 8, respectively, and are arranged on the upper surface of the flow channel substrate 32. Each of the piezoelectric actuators 33 is provided with a vibration plate 40, a lower electrode 41 (corresponding to a "first electrode" of the present teaching), a plurality of first piezoelectric bodies 42, a plurality of intermediate electrodes 43 (corresponding to a "second electrode" of the present teaching), a plurality of second piezoelectric bodies 44, and an upper electrode 45 (corresponding to a "third electrode" of the present teaching).

The vibration plate 40 is composed, for example, of silicon dioxide ($SiO_2$), silicon nitride (SiN), etc., and covers upper ends of the plurality of pressure chambers 30. The vibration plate 40 is for reed by oxidizing or nit riding an upper end part of the flow channel substrate 32.

The lower electrode 41 is common to the two pressure chamber rows 8, and is formed, for example, of platinum (Pt). The lower electrode 41 is arranged on the lower surface of the vibration plate 40, and extends continuously over the plurality of pressure chambers 30 constructing the two pressure chamber rows 8.

The plurality of first piezoelectric bodies 42 are formed of a piezoelectric material containing, as a main component thereof, lead zirconate titanate which is a mixed crystal of lead titanate and lead zirconate. The plurality of first piezoelectric bodies 42 are provided individually with respect to the plurality of pressure chambers 30, respectively. Each of the plurality of first piezoelectric bodies 42 is arranged at a part, of the upper surface (on the one side in the thickness direction) of the vibration plate 40 on which the lower electrode 41 is provided, the part overlapping in the up-down direction with a pressure chamber 30 which is included in the plurality of pressure chambers 30 and which corresponds to each of the plurality of first piezoelectric bodies 42. With this, the plurality of first piezoelectric bodies 42 are aligned in the paper width direction, similarly to the plurality of pressure chambers 30. The thickness of each of the first piezoelectric bodies 42 is, for example, approximately 0.5 μm.

Further, end surfaces 42a (corresponding to a "first end surface" of the present teaching) on the both sides in the paper width direction of each of the plurality of first piezoelectric bodies 42 are each extend while being inclined with respect to the paper width direction only by an inclination angle α1 such that the end surfaces 42a each approach more closely, in the paper width direction, to an inner side of each of the plurality of first piezoelectric bodies 42 progressively in a direction from a lower side to an upper side. With this, the two end surfaces 42a of each of the plurality of first piezoelectric bodies 42 are inclined with respect to the paper width direction to the opposite sides to each other, and at a same inclination angle with each other. The inclination angle α1 is, for example, in a range of not less than 15° to not more than 25°.

Furthermore, end surfaces 42b (corresponding to a "third end surface" of the present teaching) on the both sides in the conveyance direction of each of the plurality of first piezoelectric bodies 42 are each extend while being inclined with respect to the conveyance direction only by an inclination angle β1 such that the end surfaces 42b each approach more closely, in the conveyance direction, toward the inner side of each of the plurality of first piezoelectric bodies 42 progressively in the direction from the lower side to the upper side. With this, the two end surfaces 42b of each of the plurality of first piezoelectric bodies 42 are inclined with respect to the conveyance direction to the opposite sides to each other, and at a same inclination angle with each other. The inclination angle β1 is an angle smaller than the inclination angle α1, and is, for example, in a range of 10° to 15°.

The plurality of intermediate electrodes 43 are formed, for example, of platinum (Pt) or iridium (Ir). The plurality of intermediate electrodes 43 are provided individually with respect to the plurality of first piezoelectric bodies 42, respectively, and are arranged on the upper surfaces of the plurality of first piezoelectric bodies 42 corresponding thereto, respectively. Moreover, each of the plurality of intermediate electrodes 43 is drawn to the one side in the conveyance direction and extends up to an end part, on the one side in the conveyance direction, of the flow channel substrate 32.

The plurality of second piezoelectric bodies 44 are formed, for example, of the above-described piezoelectric material. The plurality of second piezoelectric bodies 44 are provided individually with respect to the plurality of first piezoelectric bodies 42, respectively. Each of the plurality of second piezoelectric bodies 44 is arranged on the upper surface (on the side opposite to the vibration plates 40), of one of the plurality of first piezoelectric bodies 42 corresponding thereto, the upper surface having one of the plurality of intermediate electrodes 43 arranged thereon. With this, the plurality of second piezoelectric bodies 44 are aligned in the paper width direction, similarly to the plurality of pressure chambers 30 and the plurality of first piezoelectric bodies 42. The thickness of each of the second piezoelectric bodies 44 is, for example, approximately 0.5 μm.

Further, in the paper width direction, a length W2 of each of the plurality of second piezoelectric bodies 44 is longer than a length W1 of one of the plurality of first piezoelectric bodies 42, and the positions of the both ends of each of the plurality of first piezoelectric bodies 42 are on the inner side than the positions of the both ends of one of the plurality of second piezoelectric bodies 44. In other words, in the paper width direction, the right end of each of the plurality of second piezoelectric bodies 44 is located on the right side with respect to the right end of one of the plurality of first piezoelectric bodies 42, and the left end of each of the plurality of second piezoelectric bodies 44 is located on the left side with respect to the left end of one of the plurality of first piezoelectric bodies 42. With this, each of the plurality of second piezoelectric bodies 44 covers the entirety of the end surfaces 42a on the both sides in the paper width direction of one of the plurality of first piezoelectric bodies 42.

Moreover, end surfaces 44a (corresponding to a "second end surface" of the present teaching) on the both sides in the paper width direction of each of the plurality of second piezoelectric bodies 44 are each extend while being inclined with respect to the paper width direction only by an inclination angle α2 such that the end surfaces 44a each approach more closely, in the paper width direction, toward the inner side of each of the plurality of second piezoelectric bodies 44 progressively in the direction from the lower side to the upper side. With this, the two end surfaces 44a of each of the plurality of second piezoelectric bodies 44 are inclined with respect to the paper width direction to the opposite sides to each other, and at a same inclination angle with each other. The inclination angle α2 is an angle greater than the inclination angle α1, and is, for example, in a range of not less than 25° to not more than 35°.

Further, in the conveyance direction, a length L2 of each of the plurality of second piezoelectric bodies 44 is longer than a length L1 of one of the plurality of first piezoelectric bodies 42; and the positions of the both ends of each of the plurality of first piezoelectric bodies 42 are on the inner side than the positions of the both ends of one of the plurality of second piezoelectric bodies 44. In other words, in the conveyance direction, an end on the upstream side (upstream-side end) of each of the plurality of second piezoelectric bodies 44 is located on the upstream side of an upstream-side end of one of the plurality of first piezoelectric bodies 42, and an end on the downstream side (downstream-side end) of each of the plurality of second piezoelectric bodies 44 is located on the downstream side of a downstream-side end of one of the plurality of first piezoelectric bodies 42. With this, each of the plurality of second piezoelectric bodies 44 covers the entirety of the end surfaces 42a on the both sides in the conveyance direction of one of the plurality of first piezoelectric bodies 42. For example, the length L1 of each of the plurality of first piezoelectric bodies 42 and the length L2 of each of the plurality of second piezoelectric bodies 44 are approximately 500 μm and approximately 600 μm, respectively.

Furthermore, end surfaces 44b (corresponding to a "fourth end surface" of the present teaching) on the both sides in the conveyance direction of each of the plurality of second piezoelectric bodies 44 are each extend while being inclined with respect to the conveyance direction only by an inclination angle β2 such that the end surfaces 44b each approach more closely, in the conveyance direction, toward the inner side of each of the plurality of second piezoelectric bodies 44 progressively in the direction from the lower side to the upper side. With this, the two end surfaces 44b of each of the plurality of second piezoelectric bodies 44 are inclined with respect to the conveyance direction to the opposite sides to each other, and at a same inclination angle with each other. The inclination angle β2 is an angle greater than the inclination angle β1, and is, for example, in a range of 25° to 30°.

The upper electrode 45 is formed, for example, of platinum (Pt) or iridium (Ir). The upper electrode 45 extends so as to cover the upper surfaces of the plurality of second piezoelectric bodies 44 and the end surfaces 44a on the both sides in the paper width direction of the plurality of second piezoelectric bodies 44. Further, the upper electrode 45 is drawn to the other side in the conveyance direction with respect to the plurality of first and second piezoelectric bodies 42 and 44, and overlaps with the lower electrode 41 in the up-down direction. With this, the lower electrode 41 and the upper electrode 45 are conducted with each other. Here, the term "the other side in the conveyance direction" indicates the downstream side in the conveyance direction in a case that the explanation is given about the configuration corresponding to the pressure chamber row 8 included in the two pressure chamber rows 8 and arranged on the upstream side in the conveyance direction; and the term "the other side in the conveyance direction" indicates the upstream side in the conveyance direction in a case that the explanation is given about the configuration corresponding to the pressure chamber row 8 included in the two pressure chamber rows 8 and arranged on the downstream side in the conveyance direction.

Further, a thickness T3 of the upper electrode 45 is greater than a thickness T1 of the lower electrode 41 and a thickness T2 of each of the plurality of intermediate electrodes 43. Note that, however, the thickness T3 of the upper electrode 45 is a thickness of such an extent that does not greatly inhibit the deformation of the vibration plate 40, the plurality of first piezoelectric bodies 42 and the plurality of second piezoelectric bodies 44 in a case that the piezoelectric actuator 33 is driven, as will be described later on. For example, the thickness T1 and the thickness T2 are each approximately in a range of 80 mm to 90 mm, and the thickness T3 is approximately in a range of 100 mm to 200 mm.

Furthermore, the piezoelectric actuator 33 has supply holes 33a formed in parts, of the piezoelectric actuator 33, which overlap with the ends on the other side in the conveyance direction of the pressure chambers 30, respectively, and which penetrate through the vibration plate 40, the lower electrode 41 and the upper electrode 45 in the up-down direction.

The protective substrate 34 is formed of silicon (Si), and is arranged on the upper surface of the flow channel substrate 32 on which the piezoelectric actuator 33 is arranged.

Two recessed parts 34a are formed in the lower surface of the protective substrate 34. The two recessed parts 34a correspond to the two pressure chamber rows 8, respectively, and each of the two recessed parts 34a extends in the paper width direction over or across the pressure chambers 30 constructing one of the two pressure chamber rows 8. Further, the two piezoelectric actuators 33 are stored or accommodated respectively in spaces each of which is formed between the flow channel substrate 32 and one of the two recessed parts 34.

Further, the protective substrate 34 is formed with supply channels 34b which extend in the up-down direction and which are provided on parts, of the protective substrate 34, overlapping with the supply holes 33a, respectively, in the up-down direction. A lower end of each of the supply channels 34b is connected to one of the supply holes 33a corresponding thereto, and an upper end of each of the supply channels 34b is connected to a non-depicted manifold. With this, the ink is supplied from the manifold to the plurality of pressure chambers 30 via the supply channels 34b and the supply holes 33a, respectively.

Furthermore, in the present embodiment, a part of each of the plurality of intermediate electrodes 43 is exposed from the protective substrate 34, the part of each of the plurality of intermediate electrodes 43 being located on the one side thereof in the conveyance direction with respect to the protective substrate 34. Moreover, wiring members 52 are connected to the exposed parts of the plurality of intermediate electrodes 43. The plurality of intermediate electrodes 43 are connected to a non-depicted driver IC via the wiring members 52. Either one of a ground potential or a predetermined driving potential (for example, approximately 20 V) is selectively applied, by the driver IC, individually to each of the plurality of intermediate electrodes 43.

Further, in each of the piezoelectric actuators 33, as depicted in FIG. 2, two wiring parts 46 are arranged on the upper surface of the vibration plate 40. The two wiring parts 46 are respectively connected to the both ends in the paper width direction of the lower electrode 41 and the upper electrode 45 which are overlapped with each other, and the two wiring parts 46 are drawn up to the one side in the conveyance direction. The two wiring parts 46 extend up to the end on the one side in the conveyance direction of the flow channel substrate 32. Furthermore, an end, of each of the two wiring parts 46, on the opposite side to the lower electrode 41 and the upper electrode 45 is connected to the wiring member 52. With this, the lower electrode 41 and the upper electrode 45 are connected to a non-depicted power source via the wiring members 52, and are maintained at the ground potential.

Here, an explanation will be given about a method of driving each of the piezoelectric actuators 33 so as to discharge (jet) the ink(s) from the nozzles 10. In each of the piezoelectric actuators 33, the potential of all the plurality of intermediate electrodes 43 is maintained at the ground potential which is same regarding the lower electrode 41 and the upper electrode 45. In a case of causing the ink to be discharged from a certain nozzle 10, among the nozzles 10, the potential of a certain intermediate electrode 43, included in the plurality of intermediate electrodes 43 and corresponding to the certain nozzle 10, is switched from the ground potential to the above-described driving potential. By doing so, an electric field in the thickness direction is generated in each of an active part, of a first piezoelectric body 42 included in the plurality of first piezoelectric bodies 42 and sandwiched by the lower electrode 41 and the certain intermediate electrode 43 and an active part, of a second piezoelectric body 44 included in the plurality of second piezoelectric bodies 44 and sandwiched by the certain intermediate electrode 43 and the upper electrode 45. In this situation, the active part of the first piezoelectric body 42 and the active part of the second piezoelectric body 44 are piezoelectrically deformed and are contracted in the horizontal direction. With this, a part of the vibration plate 40 and parts of the first and second piezoelectric bodies 42 and 44, which overlap with the certain pressure chamber 30 in the up-down direction, are deformed so as to project as a whole toward the certain pressure chamber 30. As a result, the volume of the certain pressure chamber 30 becomes small, which in turn increases the pressure of the ink inside the certain pressure chamber 30, thereby discharging the ink from a certain nozzle 10 included in the nozzles 10 and corresponding to the certain pressure chamber 30. Further, after the ink is discharged from the certain nozzle 10, the potential of the intermediate electrode 43 is returned back to the ground potential.

<Method of Producing Head Unit 11>

Next, an explanation will be given about a method of producing each of the head units 11 having the above-described piezoelectric actuators 33. Note that although the head units 11 are not assembled into the printer 1 in production steps of the head units 11, directions corresponding to the "paper width direction", the "conveyance direction" and the "up-down direction", respectively, of the head unit 11 at the time of production thereof are defined as the "paper width direction", the "conveyance direction" and the "up-down direction" in the following explanation, for the sake of convenience.

Figure 5A:
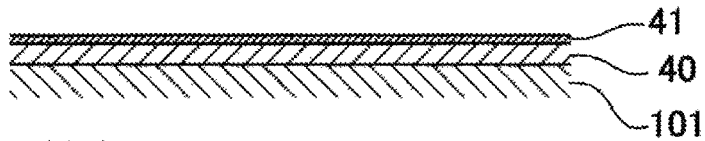
FIG. 5A is a view corresponding to a part of FIG. 3, and explaining a step of forming a lower electrode.
Figure 6A:
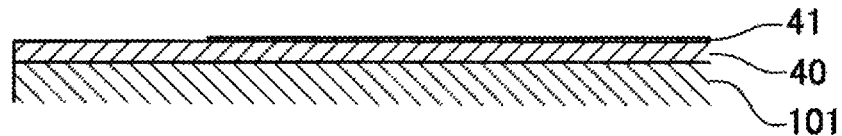
FIG. 6A is a view corresponding to a part of FIG. 4, and explaining the step of forming the lower electrode.

In a case of producing a head unit 11, firstly, the lower electrode 41 is formed on the upper surface of a vibration plate 40 which is formed by oxidizing or nitriding the upper surface of a base member 101 which is to be the flow channel substrate 32, as depicted in FIGS. 5A and 6A (first electrode forming step).

Figure 5B:
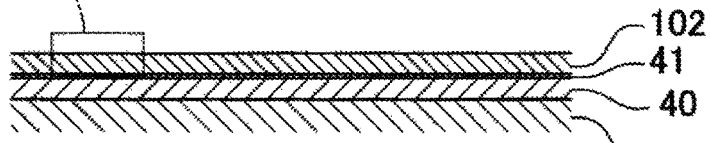
FIG. 5B is a view corresponding to the part of FIG. 3, and explaining a step of forming a first layer.
Figure 6B:
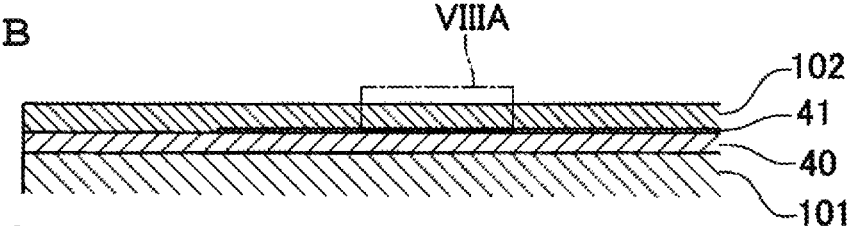
FIG. 6B is a view corresponding to the part of FIG. 4, and explaining the step of forming the first layer.

Next, as depicted in FIGS. 5B and 6B, a first layer 102 which is a layer of a piezoelectric material and which is to be the first piezoelectric bodies 42 is formed, by the sol-gel method, on the upper surface of the vibration plate 40 on which the lower electrode 41 is formed (first layer forming step). In this situation, the application (coating) of the piezoelectric material is performed by the spin coat method. Note that a detailed explanation will be given later on the formation of the first layer 102 and formation of a second layer 103 (to be described later on) by the sol-gel method.

Figure 5C:
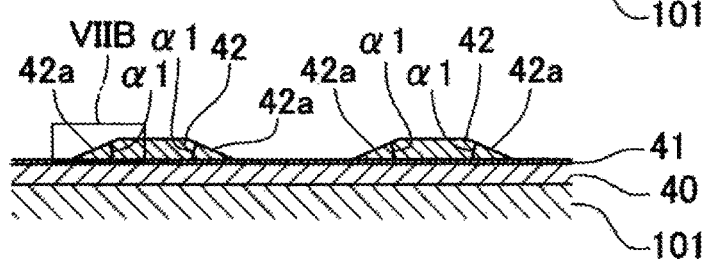
FIG. 5C is a view corresponding to the part of FIG. 3, and explaining a step of forming a first piezoelectric body by etching.
Figure 6C:
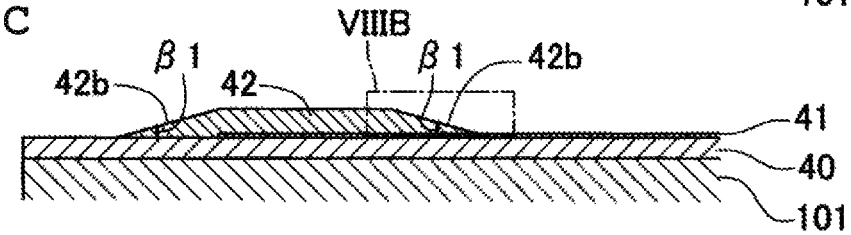
FIG. 6C is a view corresponding to the part of FIG. 4, and explaining a step of forming the first piezoelectric body by the etching.

Subsequently, as depicted in FIGS. 5C and 6C, the plurality of first piezoelectric bodies 42 are formed by performing etching for the first layer 102 (first etching step). In this situation, the etching is performed so that the inclination angle, of the end surface(s) 42a of each of the first piezoelectric bodies 42, with respect to the paper width direction becomes the inclination angle α1, and that the inclination angle, of the end surface(s) 42b of each of the first piezoelectric bodies 42, with respect to the conveyance direction becomes the inclination angle β1. The adjustment of the inclination angles of the end surfaces 42a and 42b of each of the plurality of first piezoelectric bodies 42 and the adjustment of the inclination angles of the end surfaces 44a and 44b of each of the plurality of second piezoelectric bodies 44 (to be described later on) can be performed, for example, by adjusting the bias power when performing the etching. The term "bias power" means an electric power for drawing plasma into a stage on which a target or object of the etching is placed when performing the etching.

Figure 5D:
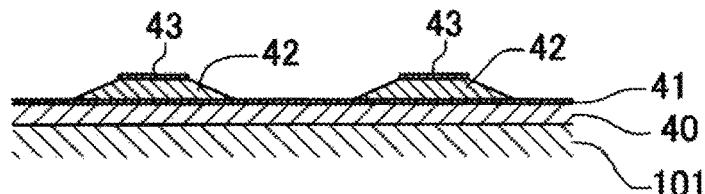
FIG. 5D is a view corresponding to the part of FIG. 3, and explaining a step of forming an intermediate electrode.
Figure 6D:
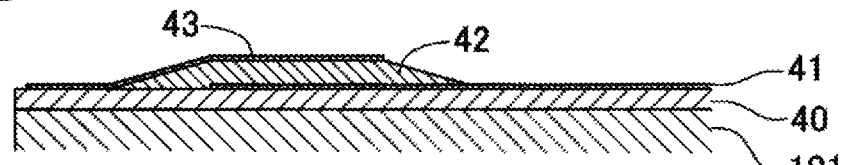
FIG. 6D is a view corresponding to the part of FIG. 4, and explaining the step of forming the intermediate electrode.

Subsequently, as depicted in FIGS. 5D and 6D, the plurality of intermediate electrodes 43 are formed on the upper surfaces of the plurality of first piezoelectric bodies 43, respectively (second electrode forming step).

Figure 5E:
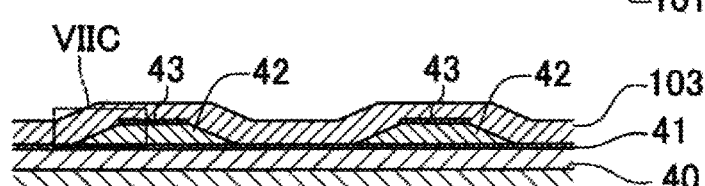
FIG. 5E is a view corresponding to the part of FIG. 3, and explaining a step of forming a second layer.
Figure 5F:
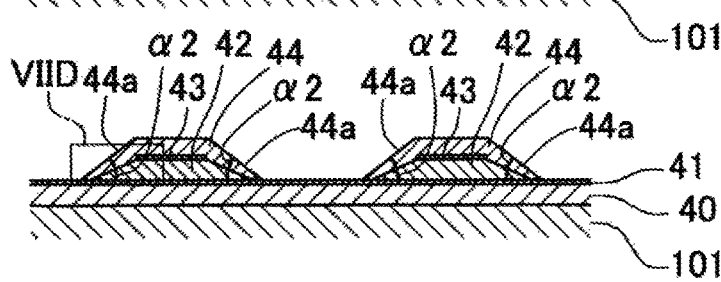
FIG. 5F is a view corresponding to the part of FIG. 3, and explaining a step of forming a second piezoelectric body.
Figure 6E:
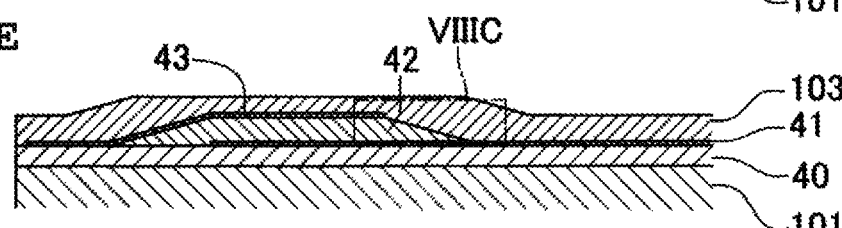
FIG. 6E is a view corresponding to the part of FIG. 4, and explaining the step of forming the second layer.
Figure 6F:
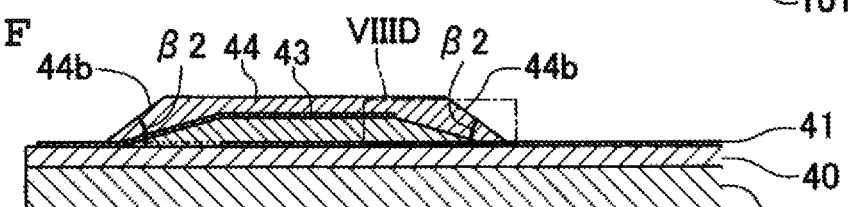
FIG. 6F is a view corresponding to the part of FIG. 4, and explaining the step of forming the second piezoelectric body.

Next, as depicted in FIGS. 5E and 6E, a second layer 103 which is a layer of a piezoelectric material and which is to be the plurality of second piezoelectric bodies 44 is formed, by the sol-gel method, on the upper surface of the vibration plate 40 on which the lower electrode 41 and the plurality of first piezoelectric bodies 42 are arranged (second layer forming step). In this situation, the application (coating) of the piezoelectric material is performed by the spin coat method. Next, as depicted in FIGS. 5F and 6F, the plurality of second piezoelectric bodies 44 are formed by performing etching for the second layer 103 (second etching step).

In this situation, the etching is performed so that the inclination angle, with respect to the paper width direction, of the end surface 44a of each of the plurality of second piezoelectric bodies 44 becomes the inclination angle α2, and that the inclination angle, with respect to the conveyance direction, of the end surface 44b of each of the plurality of second piezoelectric bodies 44 becomes the inclination angle β2. Further, in this situation, etching is performed so that a part, of the second layer 103, which covers the end surfaces 42a and 42b of each of the plurality of first piezoelectric bodies 42, are not removed.

Figure 5G:
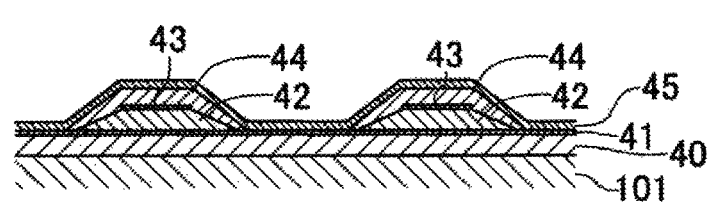
FIG. 5G is a view corresponding to the part of FIG. 3, and explaining a step of forming a lower electrode.
Figure 6G:
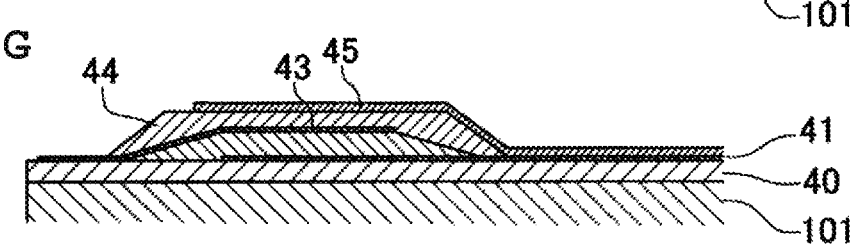
FIG. 6G is a view corresponding to the part of FIG. 4, and explaining the step of forming the lower electrode.

Subsequently, as depicted in FIGS. 5G and 6G, an upper electrode 45 which covers the vibration plate 40, the lower electrode 41, the plurality of first piezoelectric bodies 42 and the plurality of second piezoelectric bodies 44 is formed (third electrode forming step). With this, in the head unit 11, the piezoelectric actuator 33 as a constructing element or part of the head unit 11 is completed. Afterwards, the protective substrate 34 is joined to the upper surface of the base member 101; etching is preformed so as to form the pressure chambers 30, etc., in the base member 101 to thereby complete a flow channel substrate 32. Further, a nozzle plate 31 which has been produced separately is joined to the lower surface of the flow channel substrate 32. With this, the head unit 11 is completed.

<Formation of First Layer 102 and Second Layer 103 by Sol-Gel Method>

Next, an explanation will be given about the formation of the first layer 102 and the second layer 103 by the sol-gel method. In a case of forming the first layer 102 and the second layer 103 by the sol-gel method, a thin film of a piezoelectric material is formed by performing application (coating) of the piezoelectric material by the spin coat method. Further, by repeatedly performing the formation of such a thin film of the piezoelectric material, the thin film of the piezoelectric material is stacked to provide a plurality of staked layers of the thin film, thereby forming the first layer 102 and the second layer 103.

Furthermore, in this situation, every time a predetermined number (pieces) of the thin film of the piezoelectric material is stacked, the calcination of the piezoelectric material is performed. With this, in the first layer 102 and the second layer 103 which are finally formed, lamination boundaries 111 and lamination boundaries 112 are produced on the upper surfaces of the piezoelectric materials of the first and second layers 102 and 103, respectively, which are positioned at uppermost locations at the time of the calcination.

As described above, the first layer 102 is formed on the upper surface of the vibration plate 40 on which the lower electrode 41 is arranged. This surface is a flat surface parallel to the paper width direction and the conveyance direction, and thus the above-described thin films which construct the first layer 102 extends parallel to the paper width direction and the conveyance direction.

Figure 7A:
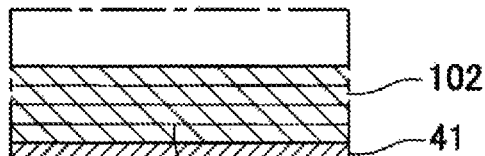
FIG. 7A is an enlarged view of a VIIA part of FIG. 5B.
Figure 7B:
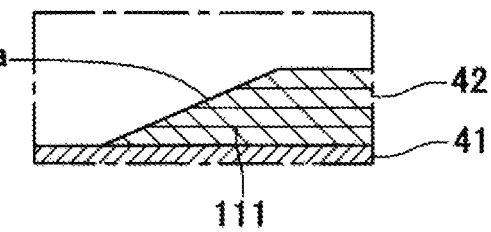
FIG. 7B is an enlarged view of a VIM part of FIG. 5C.
Figure 8A:
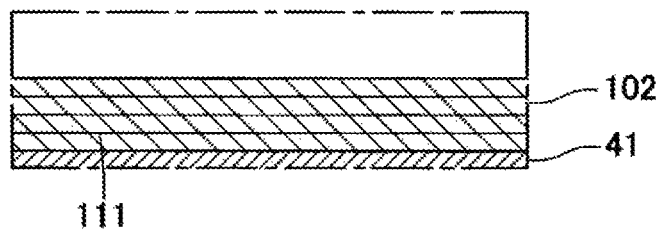
FIG. 8A is an enlarged view of a VIIIA part of FIG. 6B.
Figure 8B:
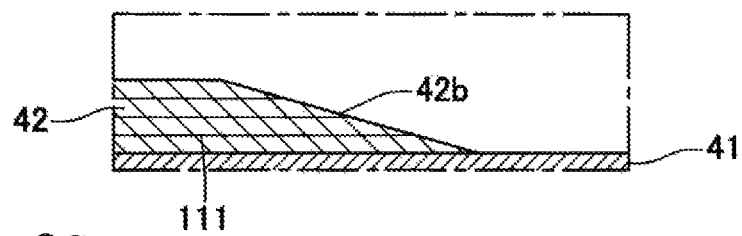
FIG. 8B is an enlarged view of a VIIIB part of FIG. 6C.

Accordingly, as depicted in FIGS. 7A and 8A, the respective lamination boundaries 111 in the first layer 102 extend in the paper width direction and the conveyance direction. As a result, as depicted in FIGS. 7B and 8B, also in each of the plurality of first piezoelectric bodies 42 formed by the etching performed for the first layer 102, the respective lamination boundaries 111 extend in the paper width direction and the conveyance direction.

In contrast, the second layer 103 is formed on the upper surface of the vibration plate 40 on which the lower electrode 41 and the plurality of first piezoelectric bodies 42 are arranged. This surface is a surface formed with concavities and convexities, having a part on which each of the plurality of first piezoelectric bodies 42 is arranged and a part on which any first piezoelectric body 42 is not arranged.

Figure 7C:
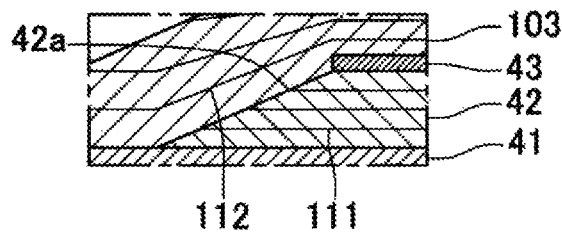
FIG. 7C is an enlarged view of a VIIC part of FIG. 5E.
Figure 8C:
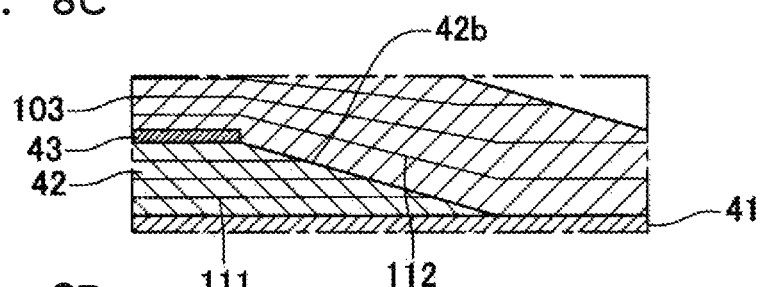
FIG. 8C is an enlarged view of a VIIIC part of FIG. 6E.

Accordingly, as depicted in FIGS. 7C and 8C, each of the lamination boundaries 112 in the second layer 103 extends in the paper width direction and the conveyance direction at a part thereof which covers the upper surface of one of the plurality of first piezoelectric bodies 42 and at a part thereof which covers the lower electrode 41. Further, each of the lamination boundaries 112 in the second layer 103 extends in a direction inclined with respect to the paper width direction at a part thereof which covers the end surface 42a of one of the plurality of first piezoelectric bodies 42, and extends in a direction inclined with respect to the conveyance direction at a part thereof which covers the end surface 42b of one of the plurality of first piezoelectric bodies 42.

Figure 7D:
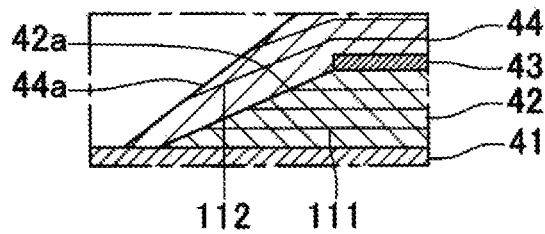
FIG. 7D is an enlarged view of a VIID part of FIG. 5F.
Figure 8D:
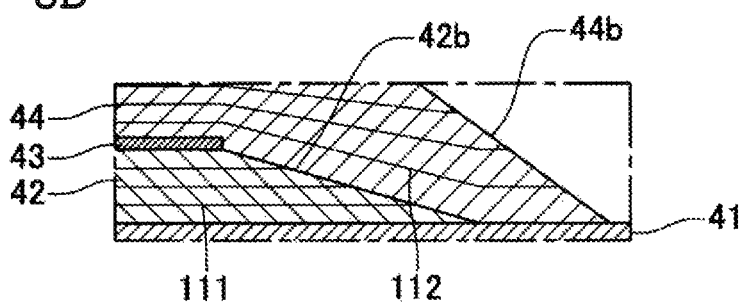
FIG. 8D is an enlarged view of a VIIID part of FIG. 6F.

As a result, as depicted in FIGS. 7D and 8D, also in each of the plurality of second piezoelectric bodies 44 formed by the etching performed for the second layer 103, each of the lamination boundaries 112 extends in the paper width direction and the conveyance direction at the part thereof which covers the upper surface of one of the plurality of first piezoelectric bodies 42. Further, each of the lamination boundaries 112 extends in the direction inclined with respect to the paper width direction at a part thereof which covers the end surface 42a of one of the plurality of first piezoelectric bodies 42, and extends in the direction inclined with respect to the conveyance direction at a part thereof which covers the end surface 42b of one of the plurality of first piezoelectric bodies 42.

<Effect>

Here, in a case of producing the piezoelectric actuator 33 with the above-described procedure, the second layer 103 is formed on a surface having the concavities and convexities including a part, of the upper surface of the vibration plate 40, on which each of the plurality of first piezoelectric bodies 42 is not arranged, and the surfaces of the plurality of first piezoelectric bodies 42. In a case that the second layer 103 is formed on such a surface having the concavities and convexities by applying the piezoelectric material on the surface with the spin coat method, the thickness of the second layer 103 varies (becomes uneven). As a result, the thickness of the plurality of second piezoelectric bodies 44 formed by performing the etching for the second layer 103 also varies. In a case that there is any variation in the thickness of the plurality of second piezoelectric bodies 44, there is such a fear that an amount of deformation (deformation amount) of each of the vibration plate 40, the plurality of first piezoelectric bodies 42 and the plurality of second piezoelectric bodies 44 when the piezoelectric actuator 33 is driven might change due to any variation in the thickness of the plurality of second piezoelectric bodies 44 and that any desired driving characteristic (performance) might not be obtained.

In view of the above situation, the present embodiment makes the inclination angle α1, with respect to the paper width direction, of the end surface 42a in the paper width direction of each of the plurality of first piezoelectric bodies 42 to be smaller than the inclination angle α2, with respect to the paper width direction, of the end surface 44a in the paper width direction of each of the plurality of second piezoelectric bodies 44. By making the inclination angle α1 to be small, the concavities and convexities become gentle or moderate at a boundary part between a part, of the vibration plate 40, at which each of the plurality of first piezoelectric bodies 42 is arranged and a part, of the vibration plate 40, at which any first piezoelectric body 42 is not arranged. As a result, it is possible to suppress, as much as possible, the variation in the thickness of the plurality of second piezoelectric bodies 44. Further, by making the inclination angle α2 to be great, it is possible to shorten, as much as possible, the length in the paper width direction of each of the plurality of second piezoelectric bodies 44, thereby making it possible to suppress the increase in the size in the paper width direction of the piezoelectric actuator.

Furthermore, in this situation, in a case that the inclination angle α1 of the end surface 42a of each of the plurality of first piezoelectric bodies 42 to be in a range of not less than 15° and not more than 20°, it is possible to effectively suppress the variation in the thickness of the plurality of second piezoelectric bodies 44. Moreover, in a case that the inclination angle α2 of the end surface 44a of each of the plurality of second piezoelectric bodies 44 to be in a range of not less than 25° and not more than 35°, it is possible to shorten, as much as possible, the length in the paper width direction of each of the plurality of second piezoelectric bodies 44.

Further, in the piezoelectric actuator 33 wherein the plurality of first piezoelectric bodies 42 and the plurality of second piezoelectric bodies 44 are arranged side by side in the paper width direction, in a case that the length in the paper width direction of each of the plurality of second piezoelectric bodies 44 becomes long, the increase in the size in the paper width direction of the piezoelectric actuator 33 becomes remarkable. Accordingly, it is of great significance to make the inclination angle α2 of the end surface 44a of the second piezoelectric body 44 to be great and to thereby shorten, as much as possible, the length in the paper width direction of the second piezoelectric body 44, as in the present embodiment.

Furthermore, in the present embodiment, the two end surfaces 42a in the paper width direction of each of the plurality of first piezoelectric bodies 42 are inclined with respect to the paper width direction to the opposite sides to each other, and at the same inclination angle with each other. Accordingly, by performing the etching in a same manner for the both sides in the paper width direction of the part, of the first layer 102, which is to be formed into each of the plurality of first piezoelectric bodies 42, it is possible to easily form each of the plurality of first piezoelectric bodies 42 having such a configuration.

Moreover, in the present embodiment, the two end surfaces 44a in the paper width direction of each of the plurality of second piezoelectric bodies 44 are inclined with respect to the paper width direction to the opposite sides to each other, and at the same inclination angle with each other. Accordingly, by performing the etching in a same manner for the both sides in the paper width direction of the part, of the second layer 103, which is to be formed into each of the plurality of second piezoelectric bodies 44, it is possible to easily form each of the plurality of second piezoelectric bodies 44 having such a configuration.

Further, in the present embodiment, each of the plurality of second piezoelectric bodies 44 covers the entirety of the end surfaces 42a in the paper width direction of one of the plurality of first piezoelectric bodes 42. Accordingly, in a case of forming the plurality of second piezoelectric bodies 44, after the formation of the plurality of first piezoelectric bodies 42, by forming the second layer 103 and by performing the etching for the second layer 103 so as to form the plurality of second piezoelectric bodies 44, there is no need to be considerate so as not to remove a part of each of the plurality of first piezoelectric bodies 42 by any over-etching, and thus the plurality of second piezoelectric bodies 44 can be formed easily.

Furthermore, the present embodiment makes the inclination angle β1, with respect to the conveyance direction, of the end surface 42b in the conveyance direction of each of the plurality of first piezoelectric bodies 42 to be smaller than the inclination angle β2, with respect to the conveyance direction, of the end surface 44a in the conveyance direction of each of the plurality of second piezoelectric bodies 44. By making the inclination angle β1 to be small, the concavities and convexities become gentle or moderate at a boundary part between a part, of the vibration plate 40, at which each of the plurality of first piezoelectric bodies 42 is arranged and a part, of the vibration plate 40, at which any first piezoelectric body 42 is not arranged. As a result, it is possible to suppress, as much as possible, the variation in the thickness of the plurality of second piezoelectric bodies 44. Further, by making the inclination angle β2 to be great, it is possible to shorten, as much as possible, the length in the conveyance direction of each of the plurality of second piezoelectric bodies 44, thereby making it possible to suppress the increase in the size in the conveyance direction of the piezoelectric actuator.

Moreover, in the present embodiment, with respect to the paper width direction in which the plurality of first piezoelectric bodies 42 are arranged, it is necessary to shorten, as much as possible, the length of each of the plurality of first piezoelectric bodies 42; whereas with respect to the conveyance direction, there is not much impact on the increase in the size of the piezoelectric actuator 33 even if the length of each of the plurality of first piezoelectric bodies 42 becomes to be long to some extent. In view of this situation, the present embodiment makes the inclination angle β1, with respect to the conveyance direction, of the end surface 42b in the conveyance direction of each of the plurality of first piezoelectric bodies 42 to be smaller than the inclination angle α1, with respect to the paper width direction, of the end surface 42a in the paper width direction of each of the plurality of first piezoelectric bodies 42. With this, it is possible to suppress any variation in the thickness of the plurality of second piezoelectric bodies 44 more effectively.

Further, it is possible to suppress the material cost in a case that the first layer 102 which is to be the plurality of first piezoelectric bodies 42 and the second layer 103 which is to be the plurality of second piezoelectric bodies 44 by the sol-gel method.

Furthermore, in a case that the first layer 102 (first piezoelectric bodies 42) and the second layer 103 (second piezoelectric bodies 44) by the sol-gel method, each of the lamination boundaries 111 of one of the plurality of first piezoelectric bodies 42 extends in the paper width direction and the conveyance direction, as described above. Moreover, each of the lamination boundaries 112 of one of the plurality of second piezoelectric bodies 44 extends in the paper width direction and the conveyance direction, at the part thereof overlapping in the up-down direction with one of the plurality of first piezoelectric bodies 42. Further, each of the lamination boundaries 112 extends in the direction inclined with respect to the paper width direction, at the part thereof covering the end surface 42a of one of the plurality of first piezoelectric bodies 42. Furthermore, each of the lamination boundaries 112 extends in the direction inclined with respect to the conveyance direction, at the part thereof covering the end surface 42b of one of the plurality of first piezoelectric bodies 42.

Furthermore, in the present embodiment, the second layer 103 is formed on the surface having the concavities and convexities, as described above, and thus the thickness of the plurality of second piezoelectric bodies 44 has a variation to some extent, and the upper surfaces of the plurality of second piezoelectric bodes 44 have the concavities and convexities to some extent. In view of this, the present embodiment makes the thickness T3 of the upper electrode 45 covering the upper surface of each of the plurality of second piezoelectric bodies 44 to be greater than the thickness T1 of the lower electrode 41 and the thickness T2 of one of the plurality of intermediate electrodes 43. With this, the upper electrode 45 is capable of covering, in an ensured manner, the upper surfaces of the plurality of second piezoelectric bodies 44 having the concavities and convexities. As a result, in a case that the piezoelectric actuator 33 is driven, it is possible to generate a desired electric field in the active portion, of each of the plurality of second piezoelectric bodies 44, which is sandwiched between the upper electrode 45 and one of the plurality of intermediate electrodes 43, thereby making it possible to obtain a desired driving performance in the piezoelectric actuator 33. Moreover, the upper electrode 45 makes it possible to protect the plurality of second piezoelectric bodies 44 from any external water or moisture.

<Modifications>

In the foregoing, the embodiment of the present teaching has been explained. However, the present teaching is not limited to or restricted by the above-described embodiment, and a variety of kinds of changes can be made to the present teaching, within the range described in the claims.

In the above-described embodiment, the inclination angle α1, with respect to the paper width direction, of the end surface 42a in the paper width direction of each of the plurality of first piezoelectric bodies 42 is in the range of not less than 15° to not more than 20°; and the inclination angle α2, with respect to the paper width direction, of the end surface 44a in the paper width direction of each of the plurality of second piezoelectric bodies 44 is in the range of not less than 25° to not more than 35°. The present teaching, however, is not limited to the above-described configuration. At least one of the inclination angles α1 and α2 may be an angle outside the above-described range, under a condition that the inclination angle α2 is greater than the inclination angle α1. In such a case, in view of suppressing any increase in the size in the paper width direction of the piezoelectric actuator, the inclination angle α1 is preferably not less than 10°. Note that, however, it is also allowable that the inclination angle α1 is less than 10°.

In the above-described embodiment, the inclination angle β1, with respect to the conveyance direction, of the end surface 42b in the conveyance direction of each of the plurality of first piezoelectric bodies 42 is made to be smaller than the inclination angle α1, with respect to the paper width direction, of the end surface 42a in the paper width direction of each of the plurality of first piezoelectric bodies 42. The present teaching, however, is not limited to the above-described configuration. The inclination angle β1 may be an angle which is not less than the inclination angle α1.

Further, in the above-described embodiment, the inclination angle β1, with respect to the conveyance direction, of the end surface 42b in the conveyance direction of each of the plurality of first piezoelectric bodies 42 is made to be smaller than the inclination angle β2, with respect to the conveyance direction, of the end surface 44b in the conveyance direction of one of the plurality of second piezoelectric bodies 44. The present teaching, however, is not limited to the above-described configuration. The inclination angle β1 may be not less than the inclination angle β2.

Figure 9:
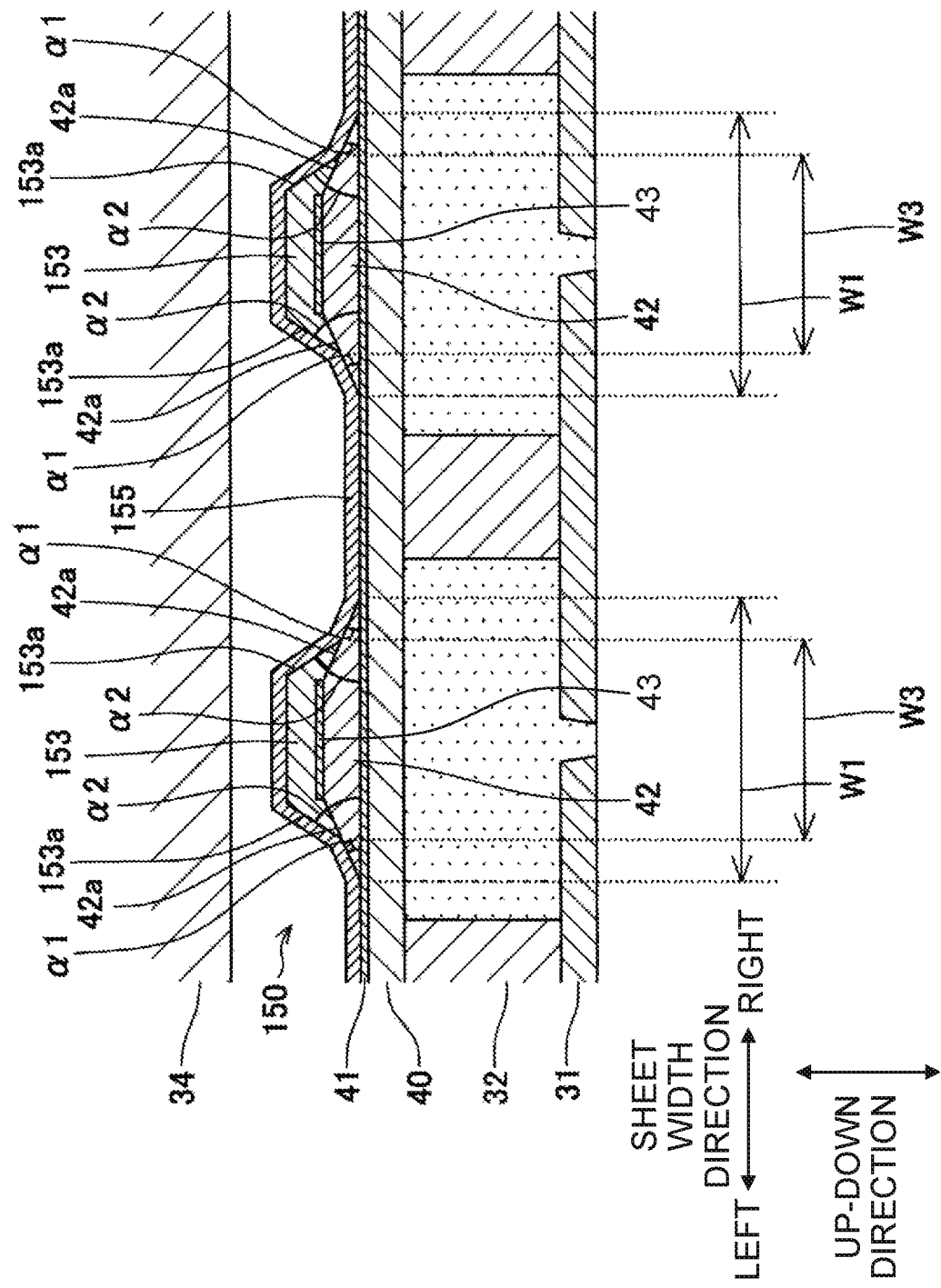
FIG. 9 is a cross-sectional view of a head unit according to a modification, and corresponding to FIG. 3.

Furthermore, in the present embodiment, each of the plurality of second piezoelectric bodies 44 covers the entirety of the end surfaces 42a in the paper width direction of one of the plurality of first piezoelectric bodies 42. The present teaching, however, is not limited to the above-described configuration. In a piezoelectric actuator 150 of a modification as depicted in FIG. 9, a length W3 in the paper width direction of each of second piezoelectric bodies 153 is shorter than the length W1 in the paper width direction of one of the first piezoelectric bodies 42. Moreover, each of the second piezoelectric bodies 153 covers only parts of the end surfaces 42a, respectively, in the paper width direction of one of the first piezoelectric bodies 42.

Here, in the piezoelectric actuator 150, a part, of each of the second piezoelectric bodies 153, sandwiched between the upper electrode 45 and one of the intermediate electrodes 43 is the active part which is piezoelectrically deformable due to the difference in the potential between the upper electrode 45 and one of the intermediate electrodes 43. However, regarding a part, of each of the plurality of second piezoelectric bodies 150, which covers the end surfaces 42a, is not sandwiched between the upper electrode 45 and one of the plurality of intermediate electrodes 43, and is an non-active part which is not piezoelectrically deformable. In the piezoelectric actuator 150, as the non-active part is greater, the deformation generated when the piezoelectric actuator 150 is driven is more inhibited by the non-active part.

In the present modification, each of the second piezoelectric bodies 153 covers only the parts of the end surfaces 42a, respectively, of one of the first piezoelectric bodies 42, as described above. Accordingly, the efficiency of deformation in the case of driving the piezoelectric actuator can be increased, as compared with the above-described embodiment wherein each of the second piezoelectric bodies 44 covers entirety of the end surfaces 42a of one of the first piezoelectric bodies 42.

Further, in the above-described embodiment, the two end surfaces 42a in the paper width direction of each of the plurality of first piezoelectric bodies 42 are inclined with respect to the paper width direction to the opposite sides to each other and at the same angle with each other. The present teaching, however, is not limited to the above-described configuration. It is allowable that the magnitudes of the inclination angles, with respect to the paper width direction, of the two end surfaces 42a in the paper width direction of each of the plurality of first piezoelectric bodies 42 may be different from each other.

Furthermore, in the above-described embodiment, the two end surfaces 42b in the conveyance direction of each of the plurality of first piezoelectric bodies 42 are inclined with respect to the conveyance direction to the opposite sides to each other and at the same angle with each other. The present teaching, however, is not limited to the above-described configuration. It is allowable that the magnitudes of the inclination angles, with respect to the conveyance direction, of the two end surfaces 42b in the conveyance direction of each of the plurality of first piezoelectric bodies 42 may be different from each other.

Moreover, in the above-described embodiment, the two end surfaces 44a in the paper width direction of each of the plurality of second piezoelectric bodies 44 are inclined with respect to the paper width direction to the opposite sides to each other and at the same angle with each other. The present teaching, however, is not limited to the above-described configuration. It is allowable that the magnitudes of the inclination angles, with respect to the paper width direction, of the two end surfaces 44a in the paper width direction of each of the plurality of second piezoelectric bodies 44 may be different from each other.

Further, in the above-described embodiment, the two end surfaces 44b in the conveyance direction of each of the plurality of second piezoelectric bodies 44 are inclined with respect to the conveyance direction to the opposite sides to each other and at the same angle with each other. The present teaching, however, is not limited to the above-described configuration. It is allowable that the magnitudes of the inclination angles, with respect to the conveyance direction, of the two end surfaces 44b in the conveyance direction of each of the plurality of second piezoelectric bodies 44 may be different from each other.

Furthermore, in the above-described embodiment, the plurality of pressure chambers 30 are aligned in the paper width direction; corresponding to this, the plurality of first piezoelectric bodies 42 and the plurality of second piezoelectric bodies 44 are each aligned in the paper width direction. The present teaching, however, is not limited to the above-described configuration. It is allowable that the arrangement of the plurality of pressure chambers 30 are different form that in the above-described embodiment; corresponding to this, it is also allowable that the arrangements of the plurality of first piezoelectric bodies 42 and the plurality of second piezoelectric bodies 44 are different from those in the above-described embodiment. Also in such a case, it is possible to suppress the increase in the size in the paper width direction of each of the plurality of second piezoelectric bodies 44, by making the inclination angle, with respect to the paper width direction, of the end surface 44a in the paper width direction of each of the plurality of second piezoelectric bodies 44 to be great.

Moreover, in the above-described embodiment, the thickness T3 of the upper electrode 45 is made to be greater than the thickness T1 of the lower electrode 41 and the thickness T2 of each of the plurality of intermediate electrodes 43. The present teaching, however, is not limited to the above-described configuration. It is allowable that the magnitude relationship among the thicknesses of the lower electrode 41, the intermediate electrodes 43 and the upper electrode 45 is different from that in the above-described embodiment. For example, it is allowable that the thicknesses of the lower electrode 41, the intermediate electrodes 43 and the upper electrode 45 are all the same.

Further, in the above-described embodiment, the first layer 102 which is to be the plurality of first piezoelectric bodies 42 and the second layer 103 which is to be the plurality of second piezoelectric bodies 44 are formed by the sol-gel method; in this situation, the application (coating) of the piezoelectric material is performed by the spin coat method. The present teaching, however, is not limited to the above-described configuration. It is allowable that the application (coating) of the piezoelectric material is performed by a method different from the spin coat method in the case of forming the first layer 102 and the second layer 103 by the sol-gel method. Furthermore, it is allowable to form the first layer 102 and the second layer 103 by a method different from the sol-gel method.

Furthermore, in the above-described example, at least parts of the end surfaces 42a on the both sides in the paper width direction of each of the plurality of first piezoelectric bodies 42 are covered by one of the plurality of second piezoelectric bodies 44. The present teaching, however, is not limited to the above-described configuration. It is allowable that only at least a part of the end surface 42a on one side in the paper width direction of each of the plurality of first piezoelectric bodies 42 is covered by one of the plurality of second piezoelectric bodies.

Moreover, in the foregoing, the example in which the present teaching is applied to a piezoelectric actuator configured to apply the pressure in the ink inside the pressure chamber in an ink-jet head configured to discharge the ink from nozzles. The present teaching, however, is not limited to the above-described configuration. For example, it is also possible to apply the present teaching to a piezoelectric actuator which is configured to apply the pressure to a liquid inside the pressure chamber in a liquid discharging head configured to discharge a liquid different from the ink. Further, it is also possible to apply the present teaching to a piezoelectric actuator which constructs an apparatus different from the liquid discharging head.

What is claimed is:

1. A piezoelectric actuator comprising:
a vibration plate;
a first piezoelectric body arranged on one side in a thickness direction of the vibration plate;
a second piezoelectric body arranged on a side, of the first piezoelectric body, which is opposite to the vibration plate in the thickness direction;
a first electrode arranged between the vibration plate and the first piezoelectric body in the thickness direction;
a second electrode arranged between the first piezoelectric body and the second piezoelectric body in the thickness direction, and overlapping with the first electrode in the thickness direction; and
a third electrode arranged on a side, of the second piezoelectric body, which is opposite to the first piezoelectric body in the thickness direction, and overlapping with the second electrode in the thickness direction,
wherein the second piezoelectric body covers at least a part of a first end surface of the first piezoelectric body, the first end surface being an end surface in a first direction orthogonal to the thickness direction, and
the first end surface is inclined with respect to the first direction at an inclination angle smaller than that of a second end surface of the second piezoelectric body, the second end surface being an end surface in the first direction.

2. The piezoelectric actuator according to claim 1,
wherein the first piezoelectric body is included in a plurality of first piezoelectric bodies arranged side by side in the first direction; and
the second piezoelectric body is included in a plurality of second piezoelectric bodies arranged side by side in the first direction.

3. The piezoelectric actuator according to claim 1,
wherein the first end surface is provided as first end surfaces on both sides, respectively, in the first direction of the first piezoelectric body, and the first end surface on one side in the first direction and the first end surface on the other side in the first direction of the first piezoelectric body are inclined, with respect to the first direction, to opposite sides to each other, and at a same inclination angle with each other.

4. The piezoelectric actuator according to claim 3,
wherein the second end surface is provided as second end surfaces on both sides, respectively, in the first direction of the second piezoelectric body, and the second end surface on one side in the first direction and the second end surface on the other side in the first direction of the second piezoelectric body are inclined, with respect to the first direction, to opposite sides to each other, and at a same inclination angle with each other.

5. The piezoelectric actuator according to claim 1,
wherein a length in the first direction of the second piezoelectric body is not less than a length in the first direction of the first piezoelectric body, and the second piezoelectric body covers entirety of the first end surface.

6. The piezoelectric actuator according to claim 1,
wherein a length in the first direction of the second piezoelectric body is shorter than a length in the first direction of the first piezoelectric body, and the second piezoelectric body covers only a part of the first end surface.

7. The piezoelectric actuator according to claim 1,
wherein the first piezoelectric body has a third end surface in a second direction which is orthogonal to both of the thickness direction and the first direction, the second piezoelectric body has a fourth end surface in the second direction, and the third end surface is inclined with respect to the second direction at an inclination angle which is smaller than that of the fourth end surface.

8. The piezoelectric actuator according to claim 7,
wherein the inclination angle, with respect to the second direction, of the third end surface is smaller than the inclination angle, with respect to the first direction, of the first end surface.

9. The piezoelectric actuator according to claim 1,
wherein the inclination angle, with respect to the first direction, of the second end surface is in a range of not less than 25° to not more than 35°, and the inclination angle, with respect to the first direction, of the first end surface is in a range of not less than 15° to not more than 20°.

10. The piezoelectric actuator according to claim 1,
wherein the first piezoelectric body and the second piezoelectric body are formed by a sol-gel method, the first piezoelectric body is constructed of a plurality of thin films of a piezoelectric material which are formed by calcination in the sol-gel method, in the first piezoelectric body, lamination boundaries between the plurality of thin films are arranged side by side in the thickness direction, the second piezoelectric body is constructed of a plurality of thin films of a piezoelectric material which are formed by calcination in the sol-gel method, the second piezoelectric body has lamination boundaries between the plurality of thin films, the lamination boundaries are arranged side by side in the thickness direction at an area covering a surface, of the first piezoelectric body, which is on the side opposite to the vibration plate, and the lamination boundaries are inclined with respect to the thickness direction at an area covering the first end surface of the first piezoelectric body, such that each of the lamination boundaries is separated farther away from the vibration plate in the thickness direction as approaching toward an inner side of the first piezoelectric body in the first direction.

11. The piezoelectric actuator according to claim 1,
wherein the third electrode has a length in the thickness direction which is longer than those of the first and second electrodes.

* * * * *